United States Patent [19]

Langer

[11] Patent Number: 4,918,401
[45] Date of Patent: Apr. 17, 1990

[54] STEP ADJUSTABLE DISTRIBUTED AMPLIFIER NETWORK STRUCTURE

[75] Inventor: Erik Langer, Marktoberdorf, Fed. Rep. of Germany

[73] Assignee: Siemens Aktiengesellschaft, Berlin and Munich, Fed. Rep. of Germany

[21] Appl. No.: 889,063

[22] Filed: Jul. 24, 1986

[30] Foreign Application Priority Data

Sep. 30, 1985 [DE] Fed. Rep. of Germany ....... 3534831

[51] Int. Cl.$^4$ .......................... H03F 3/60; H03G 3/10
[52] U.S. Cl. ..................................... 330/277; 330/286; 330/54; 333/81 R
[58] Field of Search ......................... 330/277, 286, 54; 333/81 R, 81 A, 103, 262; 307/540, 547, 548, 550, 567, 568, 572

[56] References Cited

U.S. PATENT DOCUMENTS

| | | | |
|---|---|---|---|
| 3,229,218 | 1/1966 | Sickles, II et al. | 307/550 X |
| 3,479,609 | 11/1969 | Castelli | 333/81 R X |
| 3,495,183 | 2/1970 | Doundoulakis et al. | 330/277 X |
| 3,564,442 | 2/1971 | Germann | 330/277 |
| 3,598,908 | 8/1971 | Poulett | 307/568 X |
| 3,624,530 | 11/1971 | Zwirn | 330/277 X |
| 4,523,161 | 6/1985 | Miles | 307/568 X |
| 4,595,881 | 6/1986 | Kennan | 330/277 X |
| 4,611,135 | 9/1986 | Nakayama et al. | 333/81 R X |
| 4,734,751 | 3/1988 | Hwong et al. | 330/277 X |

FOREIGN PATENT DOCUMENTS 158983 2/1983 Fed. Rep. of Germany ...... 330/277

OTHER PUBLICATIONS

Microwave Journal, 2/85, Malbon et al., pp. 121-137.
"Taschenbuch der Hochfrequenztechnik", Meinke et al., 1956, pp. 946-1203.
"Taschenbuch der Hochfrequenztechnik", Meinke et al., 1962, pp. 946-1207.
"Taschenbuch der Hochfrequenztechnik", Meinke et al., 1968, pp. 942 and 1205.
IEEE Trans. On Electron Devices, vol. ED-29, No. 7, 7/82, pp. 1072-1077.
IEEE-Conf. Digest, 1983, pp. 109-111.
Microwave Journal, 2/85, by Pallokoff, pp. 69-90.
Microwave Journal, 2/85, by Midford, pp. 95-116.

Primary Examiner—Eugene R. Laroche
Assistant Examiner—Benny Lee
Attorney, Agent, or Firm—John F. Moran

[57] ABSTRACT

The requirements of extreme miniaturization, remote operation, wide bandwidth, good reproducibility in high quantities, low cost and low insertion loss are met with an incrementally adjustable distributed network arrangement in the general configuration of a distributed amplifier. The arrangement comprises delay elements ($Z_{Dm}$, $Z_{Gm}$) and a plurality of controlled sources ($T_{n-2}$, $T_{n-1}$, $T_{ni}$ VCCS), a signal input (E) and a signal output (A). The controlled sources ($T_{n-2}$, $T_{n-1}$, $T_{ni}$ VCCS) may be selectively turned on and off. Dual gate FETs ($T_1, \ldots T_n$) are employed as controlled sources, whose first gate ($G_1$) is connected to the input signal voltage through delay elements ($Z_{Gm}$) and whose second gate ($G_2$) is maintained at suitable dc voltages for turning the respective FETs on and off.

19 Claims, 2 Drawing Sheets

STEP ADJUSTABLE DISTRIBUTED AMPLIFIER NETWORK STRUCTURE

BACKGROUND OF THE INVENTION

This invention relates to an incrementally adjustable distributed network structure, and it relates, more particularly to such a network arrangement employing a plurality of delays and a number of controlled sources interconnected in distributive fashion.

In microwave circuits for point-to-point, also line-of-sight, communication and radar technology, it is often necessary to adjust the transmit and receive channels to an exact specified amplification, or to change the amplification electronically over many decibels (e.g. 20 dB). This requirement comes about, particularly with phased array radar equipment, where, in addition to phase gradation, amplitude gradation (weighting) of the individual channels is often employed to optimize the radiation characteristic.

Mechanically switchable networks, including attenuating elements, are usually employed for the step-wise or incremental adjustment of the amplification and/or attenuation of high frequency microwave channels. If the switching is carried out electronically, the related switching diodes and transistors introduce additional, unavoidable, often undesirable insertion loss. This additional attenuation adversely affects adjustment range and maximum amplification.

If, in addition, the maximum possible attenuation range is to be attained with the minimum possible number of attenuating elements, the steps or increments in attenuation produced by the individual elements must be graded or weighted to correspond with a geometrical series with $q=2$. In that case, greater accuracy and tolerance requirements are imposed on the elements producing higher attenuation, or discontinuities in the attenuating steps will occur under some conditions. These types of networks are therefore relatively tolerance sensitive; for example, in the case of a 1 dB increments of attenuation with binary weighted series elements (1, 2, 4, 8. . . dB) the 8 dB series element must exhibit a negative error of less than 6.5%, if the 1 dB, 2 dB and 4 dB network elements have an equally large positive error of 6.5%. When these tolerances are exceeded, the desired increase in attenuation does not result in this case, but instead an (unallowable) reduction in attenuation occurs, during transition of the network from the 1 dB-, 2 dB-, and 4 dB series elements to the 8 dB series element. The higher the attenuation produced by an individual series element, the more stringent the tolerance requirement becomes relative to the attenuation of this individual element. If, for example, in the gradation just described, series elements with 1, 2, 4, 8, 16 dB are employed, the 16 dB series element may only exhibit a negative error of less than 3.17%. The series connection of attenuating elements in networks for the amplitude gradation of microwave signals is therefore a technically demanding method of fabrication.

Either the step-wise insertion of networks of attenuating elements in the amplifier train or the use of amplifiers with step-wise variable gain may be employed for the step-wise variation of channel amplification. Should the adjustment range encompass many decibels and apply, with close tolerances, over a wide frequency range, e.g. over a frequency range between one half and one octave, then the control characteristics of transistors are too inaccurate and the circuits too narrow banded for this purpose. Space and cost considerations rule out the use of mechanical switching for the adjustment of gain in many areas of microwave technology.

SUMMARY OF THE INVENTION

It is an object of the present invention to provide an incrementally adjustable distributed network of the type which features the characteristics of extreme miniaturization, remote operation, wide band width, good reproducibility in large quantity, low cost and low insertion loss.

It is also an object of the present invention to provide an incrementally adjustable distributed network structure suitable for implementation in a monolithic circuit.

The illustrated and specialized distributed amplifier structure according to the present invention not only overcomes the basic problems and concerns previously discussed, but moreover, results in a series of additional advantages, which were conventionally realized only at great cost or at the expense of other important circuit parameters. These advantages are presented in greater detail in the following description.

An incrementally adjustable network structure according to the invention lends itself for utilization in high frequency and microwave amplifiers/attenuators for phased array radar apparatus as well as point-to-point radio and measuring equipment.

In an illustrative embodiment of an incrementally adjustable distributed network structure according to the present invention, a particular network amplifier circuit is employed as a step adjustable amplifying and/or attenuating (dual gate) device.

In distributed amplifiers (DAs), the controlled sources contribute current and voltage to the output values. The wide bandwidth usually obtained with this distributed amplifier is only a desired side effect in the application being considered here; decisive however, is the ability to quantify the amplification, dependent on the number of controlled sources (transistors), whereby the maximum gain may also, under some conditions, be less than unity (maximum gain may be greater or less then 0 dB).

Since the basic characteristics of a distributed amplifier, are retained, the amplification may be raised and/or lowered in steps or increments, by connecting or disconnecting one or more sources, when the individual sources are of different strength or, in part, provide no power. A particular advantage of this technique is that transistors with stepped increases in transconductance may be used so that different increments of amplification may be obtained by connecting and disconnecting individual transistors.

The delay elements required to provide the correct phase drive direction of the transistor inputs and/or for the summing of the transistor output currents, are basically attainable with lumped reactances; however, in the microwave field the use of "transmission lines" is preferred, by means of which the arrangement becomes fully integratable monolithically and, with miniaturization, is easily introduced into the signal path of even very compact components.

Such a structure therefore, lends itself to a step adjustable amplifier as well as a step adjustable attenuator; in both cases the change from step to step may either be constant or follow a largely freely defined characteristic serving as a predetermined characteristic which may be logarithmic.

The non-linear steps indicated are not attainable with linear combinations of attenuating elements, when $2^n$ attenuating steps are required with n elements. For example, only fifteen attenuating values with constant incremental steps are obtained with a linear combination of four attenuating elements (4-bit resolution). A continuous increase or decrease of incremental step width is impossible with linear combinations of attenuating elements.

In distributed amplifiers (DA), with selectively connect and disconnect capability of individual sources, it is advantageous to employ dual gate field effect transistors (DG FET), the first gate $G_1$, of which is employed as signal gate and the second gate, $G_2$, as control gate. The gate widths may be correspondingly graduated from transistor to transistor for the indicated non-linear increments of amplification and/or attenuation. Dual gate, gallium arsenide, field effect transistors (GaAs-DG FET) are advantageously employed for operation at microwave frequencies.

Upon disconnect of individual field effect transistors, a transient will appear, especially at the source connections of the delay lines. In order to avoid these transients, it is beneficial to employ two parallel DGFETs in each stage, one of which has no signal voltage applied to its signal gate $G_1$; the two DGFETs being alternately connected to each stage. When one stage of the distributed amplifier is activated, the DGFET belonging to this stage, which has the signal voltage applied to its gate $G_1$, is in operation; when this stage of the distributed amplifier is deactivated, the other, parallel, DGFET belonging to this stage, which has no signal voltage applied to its gate $G_1$, is activated. When both DGFETs in one stage of the distributed amplifier have, respectively, the same component structures, the load on the drain delay line remains constant, independent of the activation status of the related stage of the distributed amplifier.

A particular further advantage of an incrementally adjustable distributed network arrangement according to the invention lies in the fact, that (with the same transconductance of all the field effect transistors) the phase of the output signals remains unaltered, when one or more of the field effect transistors are connected or disconnected. With unequal transconductance of the respective stages of the distributed amplifier, the corresponding phase change in the output signal due to connecting or disconnecting one field effect transistor is only a small part of the phase rotation of a single stage of the distributed amplifier.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
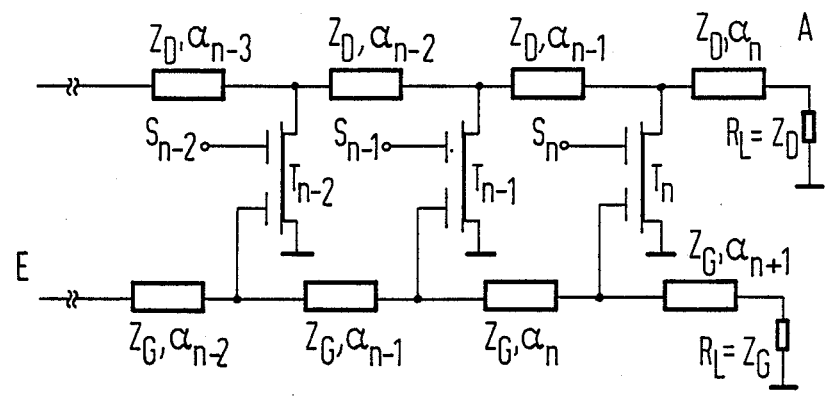
FIG. 1 illustrates a basic multi-stage, variable, distributed network arrangement in accordance with the present invention.

FIG. 1 illustrates a basic multi-stage variable distributed network arrangement in accordance with the present invention including delay elements $Z_G$, $Z_D$ and a number of controlled sources $T_n$, $T_{n-1}$, $T_{n-2}$, a signal input E, and a signal output A, of a type of distributed amplifier. The controlled sources $T_n$, $T_{n-1}$, $T_{n-2}$, are selected and may be turned on and off via the control connections $S_n$, $S_{n-1}$, $S_{n-2}$. Dual gate field effect transistors (DGFET) ($T_1 \ldots T_n$) are employed as the controlled sources. The respective first gate $G_1$, of the dual gate field effect transistors ($T_1 \ldots T_n$) is respectively connected to the signal voltage of the signal input I through the delay elements $Z_G$. The respective second gate $G_2$, of the field effect transistors ($T_1 \ldots T_n$) is connected to suitable dc voltages for turning on and off the respective dual gate field effect transistors ($T_1 \ldots T_n$) via the control connections ($S_1 \ldots S_n$).

The respective source connections of the dual gate field effect transistors ($T_1 \ldots T_n$) in the illustrative embodiment shown in FIG. 1 are connected to ground potential.

The delay elements ZD, ZG bring about a phase rotation of the current flowing through them. The respective phase rotation of the delay element $Z_{Dm}$, $Z_{Gm}$, $m \in \{1, \ldots, n+1\}$ is designated $\alpha_1 \ldots, \alpha_{n+1}$. The drain delay line as well as the signal delay line are respectively terminated with a resistance RL.

Figure 2:
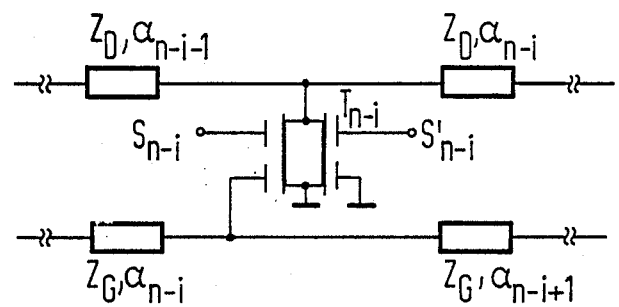
FIG. 2 depicts a unit of a multi-stage, variable, distributed network structure with two parallel dual gate field effect transistors in a single stage.

FIG. 2 illustrates a section of a stepped variable distributed network structure having one stage $T_{n-i}$, which includes two parallel dual gate field effect transistors. During the turning off of individual field effect transistors, a transient will occur especially at the drain connections for the delay lines. To prevent these transients from affecting operation, it is desirable to employ two parallel dual gate field effect transistors in each stage ($T_1 \ldots T_n$), of which one of the two parallel field effect transistors has no signal voltage applied to its first gate $G_1$. These two parallel dual gate field effect transistors of a single stage are alternately switched on via the connections $S_{n-i}$ and/or $S'_{n-i}$. In an activated stage $T_{n-i}$, the dual gate field effect transistor, whose first gate $G_1$, is connected to the signal delay line is in operation; when the stage is turned off, the parallel dual gate field effect transistor, whose first gate $G_1$, is at ground potential in the embodiment shown, is activated. When both dual gate field effect transistors in a single stage have identical switching characteristics, the loading of the drain delay lines remains constant, and independent of the connection status of the single stage.

A further feature of the arrangement according to FIG. 2 is that, for equal transconductance of all of the dual gate field effect transistors, the phase of the output signals 0 is not altered. With unequal transconductance of the stages, the respective phase change in the output signal 0 is only a small part of the phase rotation of a single stage.

Examples of typical control voltage values $S_{n-i}$, $S'_{n-i}$ follow, respectively for the second gate $G_2$, of the two parallel dual gate field effect transistors in FIG. 2.

When the stage $T_{n-i}$ is active, the control terminal $S_{n-i}$ is at a potential of +4 V and the control terminal $S'_{n-i}$ is at a potential of −4 V.

When the stage $T_{n-i}$ is inactive, the control terminal $S_{n-i}$ is at a potential of $-4$ V and the control terminal $S'_{n-i}$ is at a potential of $+4$ V.

The transients at the gate delay line, upon the blocking of gate $G_2$ are not as pronounced as would be the transient that would result on blocking the respective second gate $G_2$, at the drain delay line. The transients at the gate delay line may also be reduced, if the signal gates $G_1$, of the respective transistor system whose first gate $G_1$, is connected to the signal voltage, are only loosely coupled to the gate delay line, and where necessary, employs compensating resistances. Loose coupling is possible in this case because, the power amplification need only be about unity in the desired application and no great demands need to be made on the noise figure (NF$\leq$12 dB).

The respective parallel connected dual gate field effect transistor systems of each stage ($T_1 \ldots T_n$) may, to advantage, be integrated into a double dual gate field effect transistor with common source and drain zones.

For a first approximating calculation of a stepped, variable distributed network structure according to FIG. 1, the dual gate field effect transistors may be assumed to be voltage controlled current sources (VCCS). The result, for a single stage, the simulated circuit diagram of FIG. 3.

Figure 3:
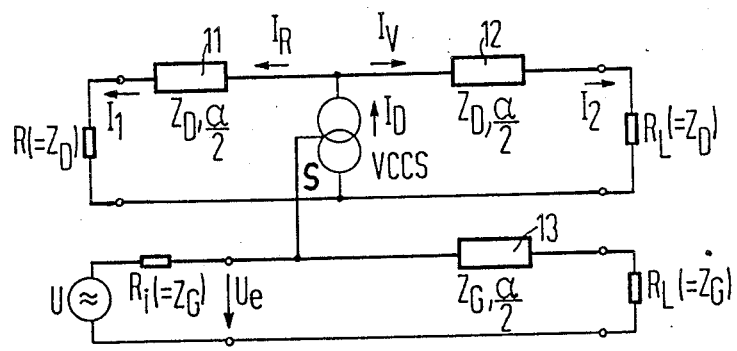
FIG. 3 is an equivalent circuit diagram of an distributed network structure having only one stage.

In FIG. 3, a controlled sources VCCS is in circuit with delay elements 11, 12, 13. The delay elements 11, 12, 13 produce a phase rotation of $\alpha/2$ during current flow through the respective delay elements 11, 12, 13. The delay elements 11, 12 have a characteristic impedance $Z_D$. The delay element 13 has a characteristic impedance of $Z_G$. The current $I_D$, which flows through the drain electrode of the respective transistor stage, is produced in the voltage controlled current source VCCS. This current $I_D$ splits into a reverse current $I_R$ and a forward current $I_V$. This reverse current $I_R$ flows through the delay element 11 and through a terminating resistance R, whose resistance value equals $Z_D$. The forward current ($I_V$) flows through the delay element 12 and through the terminating resistance $R_L$, whose value is also equal to $Z_D$.

The voltage controlled current source VCCS is controlled by the input signal voltage $U_e$ which is present at the signal input I. The input signal voltage $U_e$ is produced in a voltage source V, having an internal resistance $R_i$ with a resistance value of $Z_G$. The input signal voltage $U_e$ is also connected in a series circuit consisting of the delay element 13 and the terminating resistance $R_L$. The delay element 13 has a resistance value $Z_G$ and a phase angle $\alpha/2$. The terminating resistance $R_L$ connected in series with the delay element 13, has a resistance value of $Z_G$.

The voltage controlled current source VCCS has a transconductance S (not depicted in FIG. 3). The following relationship therefore holds for the current I which flows through the delay element 11 into the resistance R:

$$I_1 = I_D/2 = \tfrac{1}{2}(U_e \cdot S \cdot e^{-j\cdot\alpha/2}).$$

The following holds for the current $I_2$ through the delay element 12 and the terminating resistance $R_L$ in series with the delay element $$I_1 = I_D/2 = \tfrac{1}{2}(U_e \cdot S \cdot e^{-j\cdot\alpha/2}).$$

With additional stages in the distributed network structure, the forward currents adds, while with suitable selection of the electrical lengths of the transmission lines the reverse currents cancel each other.

Figure 4:
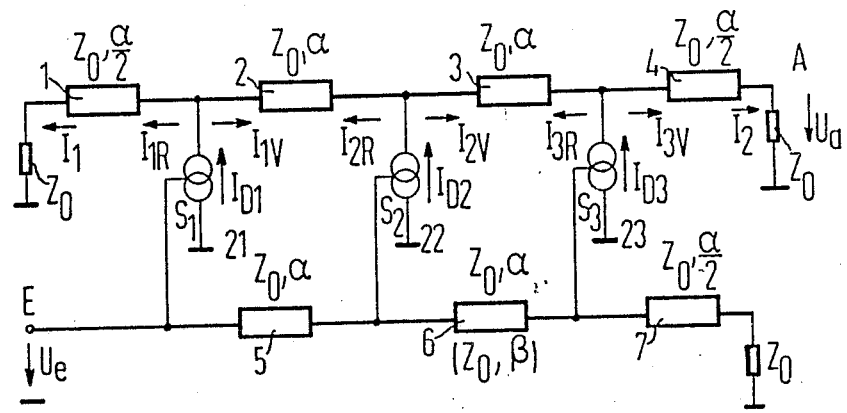
FIG. 4 illustrates an equivalent circuit diagram for an incrementally adjustable distributed network structure utilizing three stages.

In FIG. 4, a distributed network arrangement includes three voltage controlled current sources 21, 22, 23. The drain delay line shown, exhibits the delay elements 1, 2, 3, 4. The signal delay line exhibits the delay elements 5, 6, 7. In the example of FIG. 4 all of the delay elements, assumed to be lossless in the example, have the same real characteristic impedance $Z_o$. The delay elements 1, 4, 7 have a phase angle of $\alpha/2$. The delay elements 2, 3, 5 have a phase angle of $\alpha$. The delay element 6 has a phase angle of $\alpha$ in one of the embodiments to be discussed further in what follows, and a phase angle of $\beta$ in another embodiment to be discussed further in what follows, which is different in this other embodiment from the phase angle $\alpha$. The drain delay line is terminated respectively both at its beginning and at its end, with a resistance having a value of $Z_o$. The signal output voltage $U_a$ may be taken off in parallel with the terminating resistance at the output of the drain delay line.

The signal input voltage $U_e$ is applied to the input of the signal delay line. The signal delay line is also terminated with a terminating resistance which again has a resistance value of $Z_o$.

The relationships between the phase angles of the delay elements in the drain delay line and those of the signal delay line are different in FIGS. 3 and 4 from the relationship between the phase angles indicated in FIG. 1. The relationship between the phase angles shown in FIG. 1 are merely examples and are not limiting. As shown in FIGS. 3 and 4, the relationships between these phase angles of the respective delay elements may, in particular cases, be suitably matched to particular requirements.

The voltage controlled current sources 21, 22, 23 in FIG. 4 exhibit respective transconductances $S_1$, $S_2$, $S_3$. The current sources 21, 22, 23 produce the drain currents $I_{D1}$, $I_{D2}$, $I_{D3}$ respectively.

The drain currents produced respectively by the current sources 21, 22, 23 are divided into a forward current and a reverse current. For example, the drain current $I_{D1}$ produced by the current source 21 is divided into the forward current $I_1$ and into the reverse current $I_{1R}$.

A reverse current flows from the current source 21, through the delay element 1, and a forward current through the delay elements 2, 3, 4. A reverse current flows from the current source 22, through the delay elements 2, 1 and a forward current through the delay elements 3, 4. A reverse current flows from the current source 23, through the delay elements 3, 2, 1 and a forward current through the delay element 4.

The control lines for the voltage controlled current sources 21, 22, 23 are connected to the signal delay line. The delay element 5 is connected between the control voltage terminals of the current sources 21, 22 of the signal delay line. The delay element 6 is connected between the control voltage terminals of the current sources 22, 23 of the signal delay line. Finally, the delay element 7 is connected between the control voltage terminal of the current source 23 and the terminating resistance connected to the signal delay line.

The relationships between the currents, voltages and the transconductances $S_i$, of the individual transistors will be illustrated through the distributed structure shown in FIG. 4. To this end the following cases will be considered:

1. All transconductances $S_i$, are of equal magnitude. In this case the transmission line delay elements have same phase angle $\alpha$ or $\alpha/2$.

2. The transconductance of at least one transistor is different from that of the other transistors. If in FIG. 4, for example, the current source 23 exhibits a transconductance of $S_3$, which is different from the transconductance $S_1$ of the current source 21 as well as from the transconductance $S_2$ of the current source 22, then in the example of FIG. 4 the transmission line delay element 6 must produce a phase rotation $\beta$ that is different from the phase rotation $\alpha$ in order to minimize or entirely eliminate the current $I_i$ which flows through the delay element 1 and the terminating resistance at the beginning of the drain delay line.

The following equations hold for the distributed arrangement of FIG. 4;

$$I_{1R} = I_{1V} = I_{D1}/2 \qquad ;(1)$$

$$I_1 = (I_{D1} \cdot e^{-j\alpha/2})/2 + (I_{2R} \cdot e^{-j3\alpha/2})/2 + (I_{3R} \cdot e^{-j5\alpha/2})/2 \qquad (2)$$

$$I_1 = 0 \text{ for } S_1 + S_2 \cdot e^{-j2\alpha} + S_3 \cdot e^{-j4\alpha} = 0$$
$$S_1 = S_2 = S_3; \alpha = 60° \qquad (3)$$

$$I_2 = I_{1V} \cdot e^{-j5\alpha/2} + I_{2V} \cdot e^{-j3\alpha/2} + I_{3V} \cdot e^{-j\alpha/2} = \qquad (4)$$
$$(U_e \cdot e^{-j5\alpha/2}) \cdot (S_1 + S_2 + S_3)/2;$$
$$S_1 = S_2 = S_3 = S:$$

$$I_2 = 3/2(S \cdot U_e \cdot e^{-j5\alpha/2});$$

If all transconductances $S_i$, of the individual transistors in the distributed structure of FIG. 4 are of equal magnitude, the delay element 6 may also have a phase angle of $\alpha$. In this case a phase angle $\alpha$ of 60° results in the example of FIG. 4 and the total reverse current $I_1$ disappears.

If at least one of transconductances $S_i$, of an individual transistor is different than the transconductances of the remaining transistors, the following condition obtains for the disappearance of the total reverse current $I_1$:

$$I_1 = 0; S_1 + S_2 \cdot \cos 2\alpha + S_3 \cdot \cos (3\alpha + \beta) = 0 S_2 \cdot \sin 2\alpha + S_3 \cdot \sin (3\alpha + \beta) = 0 \qquad (5)$$

This condition can be met only if the delay element 6 produces a phase rotation which is different from the phase rotation $\alpha$. When the delay elements 5, 6 are in the form of transmission lines, this means that the lines 5, 6, must be of different lengths.

If the delay element 6 exhibits a phase rotation of $\beta$, the following equation holds for the total forward current $I_2$ flowing at the signal output 0 of the drain delay line;

$$I_2 = \frac{U_e}{2} \cdot e^{-j3\alpha/2} (S_1 \cdot e^{-j\alpha} + S_2 \cdot e^{-j\alpha} + S_3 \cdot e^{-j\beta}). \qquad (5a)$$

As may be observed from Equations (4) and (5a), the total forward current $I_2$ is always smaller or equal to half the sum of the transconductances multiplied by the input voltage $U_e$. The total reverse current $I_1$ is the product of the second half of the summation of the transconductances. As indicated in Equation (4) and/or (5a) the total forward current $I_2$, does not increase, even when the total reverse current disappears. Therefore, if the total forward current $I_2$ is reduced, upon switching off individual sources in a distributed network arrangement, the change in the total forward current $I_2$ is independent of the simultaneously resulting change in the total reflected current $I_1$.

The following may be stated for the phase progression of a distributed network structure:

For the case in which all transconductances $S_i$, of all transistor stages are of equal magnitude, it follows that the phase $\phi(I_2)$ of the total forward current $I_2$ is proportional to the number of stages n:

$$\phi(I_2) = (n + 2) \cdot \alpha. \qquad (6)$$
$$n = 1, 2, 3, \ldots$$

where $\alpha$ decreases with increasing number of stages in accordance with Equation (7) below.

Generalizing the results of Equation (3) into n stages, it follows that: $2 \cdot n \cdot \alpha = 360°$, therefore $$\alpha = 180°/n. \qquad (7)$$

The phase of the total forward current $I_2$ does not change at all during turn-on and turn-off of a stage.

The following applies when the transistor stages have different transconductances:

As long as the transconductance of a single transistor stage is not greater than the sum of the transconductances of the remaining stages, there is always a unique solution for the electrical lengths of the lines (delay elements), so that the total reverse current $I_1$ disappears. For a distributed network structure with 3 stages, two different line lengths ($\alpha, \beta$) are required, for a distributed network structure with 4 transistor stages, three different line lengths ($\alpha, \beta, \gamma$) are required, etc. For a distributed network structure with N transistor stages N−1 different line lengths are required when all transconductances of the individual transistor stages are separated from each other in pairs. A small phase jump then results when a transistor stage is turned on or off, the height of which is dependent upon the difference in the transconductances of the individual transistor stages. In any case, the phase jump in the total forward current $I_2$ is substantially smaller than the individual phase angles $\alpha, \beta, \gamma, \ldots$ etc. of the individual delay elements. In addition these phase jumps in the total forward current $I_2$ decrease with an increase in the number of stages.

In principle, the indicated characteristics of distributed amplifiers and the advantageous characteristics of dual gate field effect transistors in the attainment of controlled sources make this type of circuit, with the modifications in accordance with the invention, particularly useful for digitally variable microwave attenuators; and monolithic integration, with reasonable tolerance requirements, is possible.

The electrical length of the delay line need encompass only about $\lambda_\epsilon/32$ with four bit resolution. $\lambda_\epsilon$ is the wavelength of the microwave signal as a function of the dielectric constant $\epsilon$, epsilon, of the substrate material supporting the distributed amplifier. This is the equivalent of sixteen stages. This value is reduced further because of the electrical lengthening of the lines due to the FET capacitances so that line lengths of $\leq \lambda_\epsilon/40$ are adequate. For example, at a frequency of 10 GHz, this corresponds to a line length of about 100$\mu$ in the realization of a distributed network structure on substrate material of galium arsenide. This is of worthwhile economic value.

There has thus been shown and described a novel incrementally adjustable distributed network arrangement which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. An incrementally adjustable distributed network arrangement including a signal delay line connected to an input signal (E) and an output delay line providing a signal output (A), the arrangement comprising delay elements ($Z_{Gm}$, $Z_{Dm}$, $m \in \{1, \ldots, n+1\}$) and a number of controlled sources ($T_1 \ldots T_n$; VCCS), connected together to form a distributed amplifier responsive to a signal input (E) and providing a signal output (A), the distributed amplifier comprising:

(a) the number of controlled sources (VCCS) being selected to produce a predetermined level of amplification and each controlled source being individually switched to turn-on or turn-off;

(b) a plurality of dual gate FETs ($T_1 \ldots T_n$) comprising said controlled sources, each dual gate FET having a first gate ($G_1$) for receiving the input signal voltage through serially connected delay elements ($Z_{Gm}$) forming the input signal delay line, and each dual gate FET having a second gate respectively connected to receive a suitable dc voltage for turning its respective FET on and off; and (c) the dual gate FETs ($T_1 \ldots T_n$) being series connected, the respective first gates of the dual gate FETs ($T_1 \ldots T_n$) being coupled to the input signal delay line of the distributed amplifier, the respective drains of the dual gate FETs ($T_1 \ldots T_n$) being coupled to the output delay line formed by serially connected delay line elements of the distributed amplifier, the respective sources of the dual gate FETs ($T_1 \ldots T_n$) being coupled to a fixed potential, delay elements being coupled between gates of succeeding dual gate FETs and between drains of succeeding dual gate FETs, respectively, the output delay line as well as the signal delay line being respectively terminated with a resistance; and a system of second FETs wherein individual second FETs being disposed in parallel with a corresponding controlled source to form a parallel connected FET in order to avoid impedance transitions during the turning on and off of one or more controlled sources (VCCS), each individual second FET having a first gate ($G_1$) that is connected to a fixed potential and a second gate ($G_m$) that is at a switching voltage at which no current flows in the system of second FETs with the parallel connected FET, when applied signal voltage input, is active, and that this second FET system is active when there is no current flow in the parallel connected FET transistor that is provided with signal voltage.

2. An incrementally adjustable distributed network arrangement according to claim 1, wherein the controlled sources each have a transconductance in a prescribed proportional relationship to each other to provide equal increments of amplification for the distributed amplifier corresponding to the turn-on and turn-off of each additional source.

3. An incrementally adjustable distributed network arrangement according to claim 1, wherein the individual dual gate FETs each have a transconductance forming a preselected proportional relationship providing steps in amplification and the FETs $T_1, T_2, \ldots T_n$ being serially connected to continually increase or decrease the amplification.

4. An incrementally adjustable distributed network arrangement according to claim 1, wherein the number of controlled sources is at least as great as incremental steps in amplification desired.

5. An incrementally adjustable distributed network arrangement according to claim 1, wherein the controlled sources comprise DG-FETs having transconductances in preselected proportional relationship to each other so that maximum amplification is achieved, upon turning on all the sources.

6. An incrementally adjustable distributed network arrangement according to claim 1, wherein the number of controlled sources may be selectively turned on or off individually corresponding to a preselected difference in amplification.

7. An incrementally adjustable distributed network arrangement according to claim 1, wherein the FETs of the system of second FETs each comprise parallel connected FETs having a common source zone and a common drain zone.

8. An incrementally adjustable distributed network arrangement according to claim 7, wherein the number of controlled sources may selectively be turned on or off individually corresponding to a preselected difference in amplification.

9. An incrementally adjustable distributed network arrangement according to claim 7, wherein the controlled sources comprise DG-FETs having transconductances in preselected proportional relationship to each other so that maximum amplification is achieved, upon turning on all the sources.

10. An incrementally adjustable distributed network arrangement according to claim 7, wherein the number of controlled sources at least corresponds to a number of levels in amplification.

11. An incrementally adjustable distributed network arrangement according to claim 10, wherein the controlled sources comprise DG-FETs having transconductances in preselected proportional relationship to each other so that maximum amplification is achieved, upon turning on all the sources.

12. An incrementally adjustable distributed network arrangement according to claim 7, wherein the controlled sources have individual transconductances of selected values relative to each other that, the turn-on and turn-off of each additional source results in equal increments of amplification.

13. An incrementally adjustable distributed network arrangement according to claim 12, wherein the number of controlled sources is at least as great as a number of the levels in amplification desired.

14. An incrementally adjustable distributed network arrangement according to claim 12, wherein the controlled sources comprise DG-FETs having transconductances in preselected proportional relationship to each other so that maximum amplification is achieved, upon turning on all the sources.

15. An incrementally adjustable distributed network arrangement according to claim 12, wherein the number of controlled sources may selectively be turned on or off individually corresponding to a preselected difference in amplification.

16. An incrementally adjustable distributed network arrangement according to claim 7, wherein the individual FETs of the plurality each have a transconductance forming a preselected proportional relationship to provide steps in amplification and the FETs $T_1, T_2, \ldots T_n$ being serially connected to increase or decrease the amplification in a prescribed manner.

17. An incrementally adjustable distributed network arrangement according to claim 16, wherein the controlled sources comprise DG-FETs having transconductances in preselected proportional relationship to each other so that maximum amplification is achieved, upon turning on all the sources.

18. An incrementally adjustable distributed network arrangement according to claim 16, wherein the number of controlled sources at least corresponds to incremental steps in amplification.

19. An incrementally adjustable distributed network arrangement according to claim 14, wherein the number of controlled sources may selectively be turned on or off individually corresponding to a preselected difference in amplification.

* * * * *